United States Patent
Grünwald et al.

(12) 
(10) Patent No.: US 6,426,144 B1
(45) Date of Patent: Jul. 30, 2002

(54) PROCESS FOR COATING PLASTIC SUBSTRATES

(75) Inventors: Heinrich Grünwald, Niddatal; Thomas Schulte; Klaus Nauenburg, both of Hanau; Wilfried Dicken, Wächtersbach; Rudolf Beckmann, Hauen, all of (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/482,010

(22) Filed: Jan. 13, 2000

(30) Foreign Application Priority Data

Jan. 19, 1999 (DE) .......................................... 199 01 834

(51) Int. Cl.⁷ ............................................ C23C 16/453
(52) U.S. Cl. ................... 428/412; 428/446; 428/448; 428/451; 359/361; 427/579; 427/535; 427/255.6; 427/255.7
(58) Field of Search ................................ 428/412, 446, 428/448, 451; 359/361; 427/579, 535, 255.6, 255.7

(56) References Cited

U.S. PATENT DOCUMENTS

| | | | |
|---|---|---|---|
| 4,842,941 A | * | 6/1989 | Devins et al. |
| 5,007,928 A | * | 4/1991 | Okamura et al. |
| 5,156,882 A | | 10/1992 | Rzad et al. |
| 5,643,638 A | * | 7/1997 | Otto et al. |
| 6,110,544 A | * | 8/2000 | Yang et al. |

FOREIGN PATENT DOCUMENTS

| | | |
|---|---|---|
| DE | 4438359 | 5/1996 |
| DE | 19522865 | 1/1997 |
| EP | 0285870 | 10/1988 |
| EP | 0887437 | 12/1998 |
| WO | 95/23652 | 9/1995 |
| WO | 97/13802 | 4/1997 |

OTHER PUBLICATIONS

Patent abstracts of Japan, C–1292, Dec. 26, 1994, vol. 18, No. 686, 6–272018.
Patent abstracts of Japan, c–964, Jul. 21, 1992, vol. 16, No. 334, 4–99263.

* cited by examiner

*Primary Examiner*—Timothy Meeks
(74) *Attorney, Agent, or Firm*—Smith, Gambrell & Russell, LLP

(57) ABSTRACT

A process for coating plastic substrates with a transparent layer compact that is not sensitive to scratches and abrasion and resistant to atmospheric influence with a plasma flame in a vacuum chamber at some distance from the substrate. The process includes the steps of:

- a cleaning of the substrate with an oxidizing gas in a first procedural step and then
- a cross linkage with an inert gas in a second procedural step,
- an oxidizing gas and a silicon-organic compound are used in a third procedural step to produce a first barrier layer, and
- an oxidizing gas, a silicon-organic compound, and a UV-absorbing compound are used in a fourth procedural step to deposit a sublayer with UV absorbers,
- an oxidizing gas and a silicon-organic compound are used in a fifth procedural step to deposit a scratch-resistant layer,
- an inert gas and a silicon-organic compound are used in a sixth procedural step to deposit a smooth layer.

6 Claims, No Drawings

PROCESS FOR COATING PLASTIC SUBSTRATES

INTRODUCTION AND BACKGROUND

The present invention relates to a process for coating plastic substrates with a transparent layer compact that is not sensitive to scratches and abrasion and resistant to atmospheric influence by using a plasma burning in a vacuum chamber at some distance from the substrate.

It is known how to protect plastic objects by depositing a varnish-like layer, which must be transparent itself if the plastic is transparent. In the latter case acrylate, polyurethane, siloxane, ormocer, or nanocer coatings have been used with success, all of which offer protection in varying degrees against scratches and abrasion and UV rays. All of these coatings have in common that they are applied with the standard techniques for applying varnish. A series of disadvantages, which occur generally in solvent emissions and problems with the consistency of the coating, with drying, or with dust, result from this. The solution to these problems and the coating material itself are associated with considerable costs.

An alternative is to apply inorganic protective layers, for example, of silica, with the help of vapor deposition in vacuum. Thus, in WO 97/23661 a high-speed vaporization process from an oxide-former is proposed, whereby oxygen or nitrogen and additional gas-forming monomers are channeled into the vaporization zone and this mixture passes through a high-density plasma zone near the substrate to be coated.

Another very effective process resides in applying an optically transparent protective layer by using plasma chemical vapor deposition (PCVD). In this case silicon compounds, usually in the form of silanes (DE 26 50 048 and EP 0 252 870), silazanes, or siloxazanes—often hexamethyldisiloxane (HMDSO)—are converted into a layer, i.e., polymerized, usually with the addition of oxygen in a low-temperature plasma. Moreover, in U.S. Pat. No. 5,298,587 a layer produced with PCVD of the general composition $SiO:_{1.8-2.4}C_{0.3-1.0}H_{0.7-4.0}$ is proposed as protection against abrasion for various plastic parts consisting of diverse polycarbonates. As a further development it was proposed in DD 238 630 to add nitrogen and a carrier gas, for instance, argon, to an organosilicon compound. In EP 0 317 134 an object coated with a transparent, abrasion-resistant layer is described that is produced through plasma CVD of an unsaturated hydrocarbon together with a silane or fluorosilane and an oxygen source, whereby the composition of the layer is homogeneous to a great extent.

By carrying out the process appropriately, the composition of this layer can be varied in a wide range, whereby layers that are rich in amounts of hydrocarbons are distinguished by hardness and resistance to abrasion and by a certain plasticity that is low in its proportion of hydrocarbons, and as a result the layers are like silicon. This can be used to apply layers, whose hardness increases as it goes toward the surface, to plastic objects with a relatively low hardness (DE 34 13 019, U.S. Pat. No. 4,927,704, U.S. Pat. No. 5,051,308, EP 0 267 679, WO 97/13803). In so doing the differing thermal coefficients of expansion for plastic material and coating, which express themselves in the layer's improved adhesion over time, can be balanced out.

In DE 42 38 279 it is proposed that plastic objects be coated with a transparent, adhesive, and scratch-resistant layer, which also provides a good barrier effect against water, chemicals, and UV rays. In this connection a coating consisting of at least silicon, oxygen, and carbon inside at least three depths of field is standardized for different chemical compositions, whereby the silicon and oxygen content generally rises with the layer thickness and the carbon content generally falls with the layer thickness. However, experience has shown that a sufficient UV-protective effect cannot be obtained.

There nevertheless remains the problem that with SiOxCyHz or SiNxCyHz layers produced with PCVD, UV rays are transmitted regardless of the exact stoichiometry of the layers. This is especially disadvantageous when the plastic objects consist of especially UV-sensitive plastics such as polycarbonate (PC), for the surface of these plastics can be damaged—in spite of added UV absorbers—in such a way that a coated PCVD protective layer thereon detaches itself from the surface. There has therefore been no dearth of attempts to make transparent PCVD protective layers impenetrable to UV rays. For this purpose according to U.S. Pat. No. 5,156,882 a PCVD scratch-protection layer is combined with an additional UV-absorbing PVCD layer made of ZnO, $TiO_2$, $CeO_2$, or $V_2O_5$. It is, however, disadvantageous that such an additional layer can attract negative attention with its colored appearance because it has a higher refractive index than the plastic and the scratch-protection layer. This effect is lost with layer thicknesses larger than about 1 $\mu$m, but coating of such a thickness is not economical with the relatively low vapor-deposition speeds of these layers.

In EP 92 400 581 and EP 0 502 790 PCVD multi-layer systems are described that have a UV interference trap effect. Also in this case differences in the layer thickness are conspicuously visible and thus critical.

In U.S. Pat. No. 5,270,854 an optical filter coating consisting of a dye, which is deposited in a diluted, inorganic layer (preferably as vacuum-vaporized $SiO_2$), is proposed, whereby PC is used as a substrate material and is precoated with a barrier layer made of plasma-polymerized HMDSO and a protective layer made of a silicon polymer.

In accordance with JP 6025488, JP 1301723, and DE 195 22 865 an organic UV absorber is vaporized during a PCVD process for depositing a scratch-protection layer and is built into the layer. Because the most economical PCVD processes are based on a high fragmentation level of the starting substances, the danger is great that when the UV absorbers are deposited at high speeds, fragmentation will occur that is too great and thus ineffective.

On the other hand, efforts have also been made to produce UV-absorbing substances from acetone, 2-butanon, or benzene during the deposition of a PCVD scratch-protection layer in plasma. UV weathering tests nevertheless do not show an improvement in the UV stability.

Finally, EP 0 285 870 provides a solution in which the PC parts are first precoated with an intermediate layer consisting of an silicon-organic resin that contains a UV-protective compound and then are coated with an abrasion-protection outer layer, which is produced by using plasma CVD.

The surface of industrial plastics is usually sensitive to mechanical stress such as abrasion or scratching. When being used outside, the duration of use is often limited by deficient UV resistance because the material turns yellow and/or cloudy. This is especially disadvantageous with plastic objects whose function is associated with the transparency of the materials, e.g., with helmet-mounted sights, covering panes of vehicle headlights, instrumentation panels of automobiles, or plastic panels on buildings.

Therefore an object of the present invention is to create a transparent protective coating for transparent plastics such as polycarbonate (PC), polymethylmethacrylate (PMMA), or CR 39 that not only has an improved resistance to scratching and abrasion, but also an improved resistance to light rays and the influence of temperature and moisture, which, for example, is characteristic in outside weathering, and thus avoids the disadvantages of the wet deposition technique.

SUMMARY OF THE INVENTION

The above and other objects of the present invention can be achieved by a process wherein:

- in a first procedural step an oxidizing gas is introduced into a process chamber for the purpose of substrate cleaning,
- in a second procedural step an inert gas is introduced into the process chamber for the purpose of cross linkage,
- in a third procedural step an oxidizing gas and organosilicon compound are introduced into the process chamber for the purpose of depositing a first barrier layer,
- in a fourth procedural step an oxidizing gas, an organosilicon compound, and a UV absorbing compound are introduced into the chamber for the purpose of depositing a sublayer with UV absorbers, whereby the ratio of oxidizing gas to the organosilicon compound during the duration of the fourth procedural step is raised from about 0 to 1 at intervals and/or with interruptions and the plasma burns continually or in pulse-mode operation,
- in a fifth procedural step an oxidizing gas and an organosilicon compound are introduced into the chamber for the purpose of depositing a scratch-resistant layer, and
- in a sixth procedural step an inert gas and an organosilicon compound are introduced into the process chamber for the purpose of depositing a smooth layer.

Preferably with the help of a remote plasma, which is activated by microwaves or a high frequency and is not in the direct neighborhood of the plastic parts to be coated but is produced at a distance from the parts to be coated and thus indirectly—i.e., when long-lived, energy-rich particles flying out have an effect on the reaction mixture away from the area of the brightly luminous zone of the plasma—the following successive processes are carried out:

A pretreatment of the parts to be coated and the process chamber when using a plasma. The pretreatment includes one or a combination of the procedural steps explained below, which are chosen according to the condition of the plastic surfaces to be coated.

In order to remove organic impurities of the surface of the plastic parts, oxidizing gases such as oxygen, dinitrogen oxide, or nitrogen are used.

When there are insufficiently dry plastic parts or water enters into the process chamber in some other way, gases and/or vapors are used that react easily under the effect of the plasma. Preferably, such compounds are oxygen-free or low-oxygen containing volatile aluminum, tin, titanium, boron, and silicon compounds such as their hydrides, alkyls, to a limited extent also alkoxides, e.g., triethylaluminum, tetramethyl tin, triethylborate, silane, tetramethylsilane, dimethyldiethoxy-silane, or trimethylethoxisilane. Preferably, however, gases or vapors of compounds are used that form hydrogen or alkyl radicals under the effect of plasma such as hydrogen or short-chain aldehydes, ketones, alcohols, or carboxylic acids. Examples for this are formaldehyde, acetaldehyde, acetic acid, acetone, ethanol, or methanol. Especially preferred are hydrogen or methanol.

It is advantageous afterwards to carry out, on one or several of the treatments mentioned above, a cross linking of the plastic surface layer with a directly or indirectly acting plasma with one or several inert gases such as argon or helium. Nitrogen can be used for this purpose as well. In that case one must be observant that an oxidizing effect also takes place.

The gas mixture is controlled in such a way that the surface of the plastic objects is exposed as little as possible to the UV rays of wavelengths from the plasma that damage the particular plastic material. In the case of the parts to be coated that are made of polycarbonate (PC), wavelengths between 200 nm and 340 nv are avoided. For this purpose suitable gases or gas mixtures are used for the operation of the plasma. For the optical emission of the plasma, the extensive lack of damaging wave lengths can be assessed with a suitable spectrometer. Alternatively, in a remote plasma arrangement, exposure of the parts to UV rays should be avoided extensively by building optically dense screens in between the plasma and the parts to be treated. This also goes for the production of the next, diffusion-inhibiting barrier layer.

The details of plasma coating to deposit coatings on surfaces such as plastics is well known in the art and need not be repeated here.

In addition to or as an alternative to a plasma pretreatment it can be advantageous to warm the parts to be coated to a temperature between 320 K and 390 K depending on the production material that is to be coated, for example, by means of infra-red (radiation) heating.

When depositing a very thin (<100 nm) diffusion-inhibiting barrier layer on the plasma-pretreated plastic parts, the process should be carried out in such a way that the layer simultaneously acts as a barrier against oxygen, water, and fragments of organic molecules. In so doing it prevents fragments of the plastic molecules formed under the effects of the UV influence caused by weathering from diffusing off and encourages the recombination of formed radicals. By cutting the surface off from oxygen and water the photo-oxidation of formed radicals is forestalled. As a result, the process of breaking down the plastic is slowed. The thinner the barrier layer, the less it tends to separate from the surface. It is therefore important that the most effective barrier layer be deposited with a preferred layer thickness of <50 nm. The barrier layer can consist, for example, of an oxide such as silicon oxide, aluminum oxide, and magnesium oxide, or a nitride such as silicon nitride, an oxide mix, or an oxynitride.

In the case in which the barrier layer does not adhere sufficiently to the parts, it is advantageous to deposit the barrier layer at the end on the sublayer described below or to go completely without it if the scratch- and abrasion-protection layers have sufficient barrier effects.

Finally, the deposition of at least one sublayer that balances out the adhesion-promoting and mechanical stresses is carried out with the help of a plasma. In this connection one or several layer-forming substances can be condensed out of the gas phase on the plastic parts, which are kept relatively cold, without the action of a plasma and then changed into a solid layer with the help of a plasma in a plasma-inducing polymerization. Layer-building substances that can be used are organic—preferably organometallic—substances with conventionally polymerized functional groups such as C—C double bonds or oxiran rings, for example, acrylates, methacrylates, epoxy compounds, or preferably vinyl or allyl compounds.

Alternatively, one or several suitable compounds can be caused to react under the continuous direct or indirect action of a plasma and can be deposited as a layer on the plastic parts. In this connection in principle all sufficiently volatile organic or organometallic compounds are used. Preferred are, however, slightly unsaturated or saturated organic compounds that form layers with a relatively low absorption of visible light under these conditions. Preferred are organometallic compounds, especially silicon, boron, or aluminum compounds, from which even lighter, low-absorption layers can be produced. One must, nonetheless, observe that the layers do not become too rich in oxygen or nitrogen or they will lose their required properties—to deflect the mechanical stress between the actual protective layer and the plastic part. The sublayer can have a hardness grade index so that it is softer with respect to the substrate.

Finally, the deposition of at least one scratch- and abrasion-protection layer under the action of a plasma occurs on at least one organometallic, aluminum, boron, or preferably organosilicon compound, which is brought into the process chamber in the form of gas or vapor. To improve the mechanical properties of the layer, oxygen or an oxygen-containing compound in the form of gas or vapor, e.g., dinitrogen oxide, is added in this connection. In the case of an indirect plasma effect, the feeding of the oxygen or oxygen-containing compound is distributed and used both as the activation gas (which traverses the plasma zone and is activated by it) and the carrier gas (which is introduced in with the organosilicon compounds downstream from the plasma). Otherwise argon, nitrogen, and carbon dioxide alone or in various combinations can be used as the activation gas and/or carrier gas. By adding <20% of an inert gas, preferably helium or argon, to the plasma, when there is an indirect plasma effect on the activation gas, the abrasion resistance and barrier effect of the layer are increased. It can make sense to combine several such protective layers with different properties in each case in such a way that the hardness is alternatively higher from layer to layer or increases with the deposited total thickness of the layer. As an alternative, a property gradient (e.g., hardness) can be achieved by continuously changing the layer production parameters inside the scratch- and abrasion-protection layer.

Experience shows that the abrasion resistance is increased by depositing an additional layer on the protective layer that is distinguished by a low coefficient of friction (a smooth or slick layer). As is known from experience, such a layer is also produced with plasma CVD or remote plasma CVD. In this connection pure hydrocarbons, carbon fluoride, or preferably organosilicon compounds without a special addition of oxygen are used as starting substances.

It is essential that in the sublayer and/or the scratch- and abrasion-protection is layer at least one UV-ray absorbing substance (=UV absorber) is built in. Both organic and primarily inorganic substances can be used as UV absorbers.

When using organic UV absorbers the following procedure is taken. The UV-absorbing substance is thermally vaporized in a vacuum essentially without plasma and incorporated into the vapor-deposited layer. The result is that it can be advantageous to carry out the vaporization process with at least another compound with a similar boiling point, preferably an organosilicon organic compound such as diphenyl-dimethylsilane together with the UV absorber. In general the vaporization of the UV absorber is separated spatially, or preferably temporally, from the plasma that causes the production of the layer. This is made possible by producing the layer with the help of a so-called "downstream" or "remote plasma" arrangement, and the vaporization of the UV absorber is carried out sufficiently far from the plasma and as close to the plastic parts as possible. Alternatively, the vaporization process and the plasma process forming the sublayer or protective layer are pulsed in a push-pull fashion, i.e., the brief vaporization of the UV absorber and plasma processes alternate and therefore essentially do not occur at the same time. In this connection the vapor of the UV absorber condenses on the parts to be coated without the action of the plasma and is built into the sublayer or protective layer formed by it in the successive plasma process.

The substances known as UV absorbers can be used as UV absorbers as long as they are transparent and volatile when undecomposed in the area of visible light, for example, 2-hydroxybenzophenes, ester of cinnamic acid or oxalanilide, preferably 2-hydroxyphenylbenzotriazols or organic nickel compounds. Benzophenones and esters of cinnamic acid are, in this connection, less preferred, because the carbonyl groups contained in them tend to elimination especially under direct, but also indirect, action of a plasma, and the UV-absorbing substance is, as a result, decomposed. The process must be carried out in such a way that the UV-absorbing substances are, if possible, exposed only with a very small dose (performance x time) to either a direct plasma or indirect plasma action. When using UV absorbers that decompose easily under the plasma action, it is preferred to vaporize the UV absorbing substance(s) in a pulsing fashion and thus to switch off the plasma briefly.

The UV protective action of layers with UV absorbers can be positively influenced by converting alcohols, ketones, epoxides, or water under an indirect plasma action to alkoxy or hydroxy radicals and by building them into the vapor-deposited layer. For this purpose the elimination of alkoxy or hydroxy groups of UV absorbers that are disadvantageously caused by the plasma can, on the one hand, at least be partly canceled and in so doing the UV extinction is raised. On the other hand, building additional alkoxy, hydroxy, or keto-functions into the UV-absorbing compounds can expand the area of the absorbing compounds without bothersome absorption occurring in the area of the visible light.

As an alternative, the UV-absorbing substance is synthesized with the help of a plasma. In this case suitable starting substances are caused to react either directly or indirectly in a plasma, i.e., "downstream" or "remote" from a plasma in such a way that the UV-absorbing chemical structures develop in the layer produced as a result. Such structures are distinguished by the existence of n-bond systems with four or more conjugated double bonds. These rings can, for example, consist of aromatic rings, which are conjugated with additional multiple bonds, for example, in the form of double or triple bonds in combination with carbon and/or nitrogen atoms and the like or with other aromatic substances. Conjugation with carbonyl groups is also possible, but not as preferable, because they tend to elimination under direct or indirect plasma effects. It should furthermore be observed that too strongly extended n-bond systems absorb visible light. The process must be carried out in such a way that no n-bond systems that are very extended arise. The actual color of the coating that occurs is usually not desirable. Suitable starting compounds are especially o-phenylenediamine with o-aminophenol or o-hydroxybenzonitrile. Alternatively, 2-aminophenol and benzaldehyde, methylcyanide and phenol, benzonitrile and phenol, styrol and oxygen, or benzonitrile and catechol can be converted to UV-absorbing structures.

Building in the UV absorbers can at the same time lead to vapor-depositing reactions of a sublayer or protective layer, influencing it nonetheless in such a way that an abrasion- or scratch-protection layer is less resistant by building in organic UV absorbing structures. For this reason the process of building in organic UV absorbers is carried out in the sublayer.

By using inorganic UV absorbers the following procedure is used. During the deposition of the sublayer and/or the scratch- and abrasion-protection layer one or several metal compounds forming vapor under the action of an oxygen plasma are introduced into the deposition chamber. Metal compounds that are used are those metals that alone or combined with silicon UV-absorbing oxides form oxynitrides or nitrides and which have a sufficiently high vapor pressure. Examples are carbonyls, metallocenes, alkyls, nitrates, acetylacetonates, or alkoxy compounds of the metals cerium, zinc, titanium, vanadium, or preferably of lead, nickel, or tin. In this connection it can be necessary to add nitrogen to the oxygen plasma.

In the case of a tested process three coating chambers are each equipped with a microwave plasma source extending over a wide area (formed from many individual microwave antennas) with a total output each of 8 KW (2.45 GHz). The gases oxygen, argon, and hexamethyldisiloxane (HMDSO) required for the plasma processes are introduced into the coating chamber through mass flow metering hoppers and gas-feeding pipes heated to 45° C. 2-(2H-benzotriazol-2-y)-4,6-di-tert.-pentylphenol (BPP) is introduced into the coating chamber through separated gas-feeding pipes heated to 180° C. on a vaporizer heated to 165° C. In this connection, it is foreseen that the gas-feeding pipe for argon is connected on the side (upstream) of the microwave plasma source turned away from the plastic parts. The gas-feeding pipe for oxygen empties on both sides, upstream and downstream of the microwave plasma source, and the gas feeding pipes for hexamethyldisiloxane (HMDSO) and BPP empty into the coating chamber only on the side (downstream) of the microwave plasma source turned toward the plastic parts. The coating chamber is evacuated constantly with a vacuum pump stand with a suction speed of 2000 m$^3$/h.

Injection molding plates made of polycarbonate (LS 2-11 of General Electric Plastics) and stored under clean conditions for less than 15 days are used as the substrate material.

The plastic parts are fastened to a frame-shaped holding device in such a way that the side to be coated is turned toward the particular microwave source during the coating process. Before loading a holding device into a lock chamber the plastic parts are warmed by using infra-red (radiation) heating to 363 K (70°).

The holding device is loaded into the lock chamber. Subsequently a loading door is locked and the lock chamber is evacuated with the help of a vacuum pump stand. Meanwhile the holding device is transferred by a lever mechanism in a recess of a rotatingly positioned substrate intake, which is inside a transport chamber that is also under vacuum. After reaching a pressure of 2 Pa, four sluice valves arranged inside the unit, which seal the coating chamber and the lock chamber, together with the recess of the substrate intake across from it, are opened and the substrate intake rotated by 90°. In so doing the plastic parts that were last fed on the holding device are transported into the first coating chamber, whereby the side of the microwave plasma source to be coated faces it. The sluice valves are closed and thus the lock chamber and the coating chambers are again sealed in relation to the transportation chamber. Then successive remote plasma processes are carried out.

Pretreatment
Cleaning:
 400 cm$^3$/min oxygen (inlet upstream)
 4 kw microwave power
 plasma duration: 30 s
Cross Linking:
 100 cm$^3$/min argon (inlet upstream)
 6 kW microwave power
 plasma duration: 120 s
Deposition of a Barrier Layer
 400 cm$^3$/min oxygen (inlet upstream)
 500 cm$^3$/min oxygen (inlet downstream)
 100 cm$^3$/min HMDSO
 8 kw microwave power
 plasma duration: 60 s Finally the holding device with the plastic parts is further transported, as described above, into the following coating chamber and the following process sequences are carried out:

Deposition of the Sublayer With UV Absorbers
 400 cm$^3$/min oxygen (inlet upstream)
 250 cm$^3$/min HMDSO
 6 kW microwave power
 plasma duration: 25 s
 400 cm$^3$/min oxygen (inlet upstream)
 400 cm$^3$/min oxygen (inlet downstream)
 250 cm$^3$/min HMDSO
 6 kW microwave power
 plasma duration: 25 s
 400 cm$^3$/min oxygen (inlet upstream)
 800 cm$^3$/min oxygen (inlet downstream)
 250 cm$^3$/min HMDSO
 6 kW microwave power
 plasma duration: 25 s
 400 cm$^3$/min oxygen (inlet upstream)
 1200 cm$^3$/min oxygen (inlet downstream)
 250 cm$^3$/min HMDSO
 6 kW microwave power
 plasma duration: 25 s During all of the procedural steps in this coating chamber a constant stream of BPP is introduced with a partial pressure of 2 Pa.

Deposition of the Scratch-protection Layer
 400 cm$^3$/min oxygen (inlet upstream)
 1200 cm$^3$/min oxygen (inlet downstream)
 250 cm$^3$/min HMDSO
 8 kW microwave power
 plasma duration: 120 s Finally the holding device with the plastic parts is transported further into the following coating chamber, as described above, and the following process sequences are carried out:

Deposition of the Scratch-protection Layer
 400 cm$^3$/min oxygen (inlet upstream)
 100 cm$^3$/min argon
 1200 cm$^3$/min oxygen (inlet downstream)
 250 cm$^3$/min HMDSO
 8 kW microwave power
 plasma duration: 200 s Deposition of the Smooth Layer 400 cm³/min argon 250 cm³/min HMDSO 6 kW microwave power plasma duration: 25 s Finally the holding device with the plastic parts is transported further in the lock chamber and, after the lock chamber is aired out, it is removed again from the unit.

It is understood that the unit is operated with the advantage that in each case a holding device in each of the coating chambers and the lock chambers are processed synchronously.

Further variations and modifications of the foregoing will be apparent to those skilled in the art from a consideration hereof and are intended to be encompassed by the claims appended hereto.

German priority application 199 01834.0 is relied on and incorporated herein by reference.

We claim:

1. A process for coating a plastic substrate with a transparent layer compact that is not sensitive to scratches and abrasion and resistant to atmospheric influence with a plasma flame in a vacuum chamber at some distance from the substrate, comprising:

introducing an oxidizing gas into a process chamber in a first procedural step for the purpose of substrate cleaning, introducing an inert gas into said process chamber in a second procedural step for the purpose of cross linking, introducing an oxidizing gas and an organosilicon compound into said process chamber in a third procedural step for the purpose of depositing a first barrier layer, introducing an oxidizing gas, an organosilicon compound, and a UV-absorbing compound in a fourth procedural step into said process chamber for the purpose of depositing a sublayer with UV absorbers, introducing an oxidizing gas and an organosilicon compound into said process chamber in a fifth procedural step for the purpose of depositing a scratch-resistant layer, and introducing an inert gas and an organosilicon or fluorocarbon compound into said process chamber in a sixth procedural step for the purpose of depositing a smooth layer.

2. A process for coating a plastic substrate with a transparent layer compact that is not sensitive to scratches and abrasion and resistant to atmospheric influence with a plasma flame in a vacuum chamber at some distance from the substrate, comprising:

introducing an inert gas into a process chamber in a first procedural step for the purpose of cross linking, introducing an oxidizing gas and an organosilicon compound into said process chamber in a second procedural step for the purpose of depositing a first barrier layer, introducing an oxidizing gas, an organosilicon compound, and a UV-absorbing compound into said process chamber in a third procedural step for the purpose of depositing a sublayer with UV absorbers, introducing an oxidizing gas and an organosilicon compound into said process chamber in a fourth procedural step for the purpose of depositing a scratch-resistant layer, and introducing an inert gas and an organosilicon compound into said process chamber in a fifth procedural step for the purpose of depositing a smooth layer.

3. A process for coating a plastic substrate with a transparent layer compact that is not sensitive to scratches and abrasion and resistant to atmospheric influence with a plasma flame in a vacuum chamber at some distance from the substrate, comprising:

introducing an oxidizing gas, an organosilicon compound, and a UV-absorbing compound into said process chamber in a first procedural step for the purpose of depositing a sublayer with UV absorbers, and introducing an oxidizing gas and an organosilicon compound into said process chamber in a second procedural step for the purpose of depositing a scratch-resistant layer.

4. An article made of transparent plastic coated with a protective transparent layer compact that is not sensitive to scratches and abrasion and is resistant to atmospheric influence with a plasma flame in a vacuum chamber at some distance from the substrate, wherein said transparent layer compact is made by a process, comprising:

introducing an oxidizing gas into a process chamber in a first procedural step for the purpose of substrate cleaning, introducing an inert gas into said process chamber in a second procedural step for the purpose of cross linking, introducing an oxidizing gas and an organosilicon compound into said process chamber in a third procedural step for the purpose of depositing a first barrier layer, introducing an oxidizing gas, an organosilicon compound, and a UV-absorbing compound in a fourth procedural step into said process chamber for the purpose of depositing a sublayer with UV absorbers, introducing an oxidizing gas and an organosilicon compound into said process chamber in a fifth procedural step for the purpose of depositing a scratch-resistant layer, and introducing an inert gas and an organosilicon or fluorocarbon compound into said process chamber in a sixth procedural step for the purpose of depositing a smooth layer.

5. An article made of transparent plastic coated with a protective transparent layer compact that is not sensitive to scratches and abrasion and is resistant to atmospheric influence with a plasma flame in a vacuum chamber at some distance from the substrate, wherein said transparent layer compact is made by a process, comprising:

introducing an inert gas into a process chamber in a first procedural step for the purpose of cross linking, introducing an oxidizing gas and an organosilicon compound into said process chamber in a second procedural step for the purpose of depositing a first barrier layer, introducing an oxidizing gas, an organosilicon compound, and a UV-absorbing compound into said process chamber in a third procedural step for the purpose of depositing a sublayer with UV absorbers, introducing an oxidizing gas and an organosilicon compound into said process chamber in a fourth procedural step for the purpose of depositing a scratch-resistant layer, and introducing an inert gas and an organosilicon compound into said process chamber in a fifth procedural step for the purpose of depositing a smooth layer.

6. An article made of transparent plastic coated with a protective transparent layer compact that is not sensitive to scratches and abrasion and is resistant to atmospheric influence with a plasma flame in a vacuum chamber at some distance from the substrate, wherein said transparent layer compact is made by a process, comprising:

introducing an oxidizing gas, an organosilicon compound, and a UV-absorbing compound into said process chamber in a first procedural step for the purpose of depositing a sublayer with UV absorbers, and introducing an oxidizing gas and an organosilicon compound into said process chamber in a second procedural step for the purpose of depositing a scratch-resistant layer.

* * * * *